(12) United States Patent
Li et al.

(10) Patent No.: US 11,744,059 B2
(45) Date of Patent: Aug. 29, 2023

(54) FIN FIELD-EFFECT TRANSISTOR (FINFET) STATIC RANDOM ACCESS MEMORY (SRAM) HAVING PASS-GATE TRANSISTORS WITH OFFSET GATE CONTACT REGIONS

(71) Applicant: QUALCOMM Incorporated, San Diego, CA (US)

(72) Inventors: Xia Li, San Diego, CA (US); Haining Yang, San Diego, CA (US); Bin Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 73 days.

(21) Appl. No.: 16/712,063

(22) Filed: Dec. 12, 2019

(65) Prior Publication Data

US 2021/0183869 A1 Jun. 17, 2021

(51) Int. Cl.
*H10B 10/00* (2023.01)
*H01L 29/66* (2006.01)
(Continued)

(52) U.S. Cl.
CPC .......... *H10B 10/12* (2023.02); *G11C 11/412* (2013.01); *H01L 27/0207* (2013.01);
(Continued)

(58) Field of Classification Search
CPC .......... H01L 27/1104; H01L 27/0207; H01L 21/823431; H01L 21/823821;
(Continued)

(56) References Cited

U.S. PATENT DOCUMENTS 9,991,268 B1 * 6/2018 Liaw .................... G11C 11/412
2008/0083991 A1 * 4/2008 Yang ................... H01L 21/0338
257/758

(Continued)

OTHER PUBLICATIONS

Mun S.Y., et al., "14nm FinFET Technology SRAM Cell Margin Evaluation and Analysis by Local Layout Effect", 2017 IEEE SOI-3D-Subthreshold Microelectronics Technology Unified Conference (S3S), Oct. 2017, 2 pages.

(Continued)

*Primary Examiner* — Younes Boulghassoul
(74) *Attorney, Agent, or Firm* — Patterson + Sheridan, L.L.P.

(57) ABSTRACT

Certain aspects are directed to a static random access memory (SRAM) including an SRAM cell with a pass-gate (PG) transistor having increased threshold voltage to improve the read margin of the SRAM cell. The SRAM generally includes a first SRAM cell having a pull-down (PD) transistor and a PG transistor coupled to the PD transistor. In certain aspects, the SRAM includes a second SRAM cell, the second SRAM cell being adjacent to the first SRAM cell and having a PD transistor and a PG transistor coupled to the PD transistor of the second SRAM cell. The SRAM may also include a gate contact region coupled to a gate region of the PG transistor of the first SRAM cell, wherein at least a portion of the gate contact region is offset from a midpoint between the first SRAM cell and the second SRAM cell.

14 Claims, 6 Drawing Sheets

(51) Int. Cl.
*G11C 11/412* (2006.01)
*H01L 29/78* (2006.01)
*H01L 27/02* (2006.01)

(52) U.S. Cl.
CPC ...... *H01L 29/66795* (2013.01); *H01L 29/785* (2013.01); *H01L 29/7851* (2013.01)

(58) Field of Classification Search
CPC ............... H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 27/1108; H01L 2924/1437; H01L 21/823475; H01L 21/823871; H01L 21/76895; G11C 11/412; G11C 5/06–066; G11C 5/025; H10B 10/12; H10B 10/125

See application file for complete search history.

(56) References Cited

U.S. PATENT DOCUMENTS

2016/0372316 A1\* 12/2016 Yang ....................... H10B 10/12
2021/0098467 A1\* 4/2021 Fujiwara ............. H01L 27/0924

OTHER PUBLICATIONS

Zhao P., et al., "Influence of Stress Induced CT Local Layout Effect (LLE) on 14nm FinFET", 2017 Symposium on VLSI Technology Digest of Technical Papers, Jun. 2017, pp. T228-T229.

\* cited by examiner

FIN FIELD-EFFECT TRANSISTOR (FINFET) STATIC RANDOM ACCESS MEMORY (SRAM) HAVING PASS-GATE TRANSISTORS WITH OFFSET GATE CONTACT REGIONS

FIELD OF THE DISCLOSURE

The present disclosure generally relates to a memory device and, more particularly, to a static random access memory (SRAM).

DESCRIPTION OF RELATED ART

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices. For example, transistors may be used to implement a static random access memory (SRAM). An SRAM is a type of volatile memory that uses a flip-flop to store a bit of information.

SUMMARY

Certain aspects of the present disclosure are directed to a static random access memory (SRAM) and techniques for fabricating the same.

Certain aspects are directed to an SRAM. The SRAM generally includes a first SRAM cell having a pull-down (PD) transistor and a pass-gate (PG) transistor coupled to the PD transistor. In certain aspects, the SRAM includes a second SRAM cell, the second SRAM cell being adjacent to the first SRAM cell and having a PD transistor and a PG transistor coupled to the PD transistor of the second SRAM cell. The SRAM may also include a gate contact region coupled to a gate region of the PG transistor of the first SRAM cell, wherein at least a portion of the gate contact region is offset from a midpoint between the first SRAM cell and the second SRAM cell.

Certain aspects are directed to a method for fabricating an SRAM. The method generally includes forming a first SRAM cell by forming a pull-down (PD) transistor and forming a pass-gate (PG) transistor coupled to the PD transistor, forming a second SRAM cell adjacent to the first SRAM cell by forming a PD transistor and forming a PG transistor coupled to the PD transistor of the second SRAM cell, and forming a gate contact region coupled to a gate region of the PG transistor of the first SRAM cell, wherein at least a portion of the gate contact region is offset from a midpoint between the first SRAM cell and the second SRAM cell.

Other aspects, advantages, and features of the present disclosure will become apparent after review of the entire application, including the following sections: Brief Description of the Drawings, Detailed Description, and the Claims.

DETAILED DESCRIPTION

Figure 1:
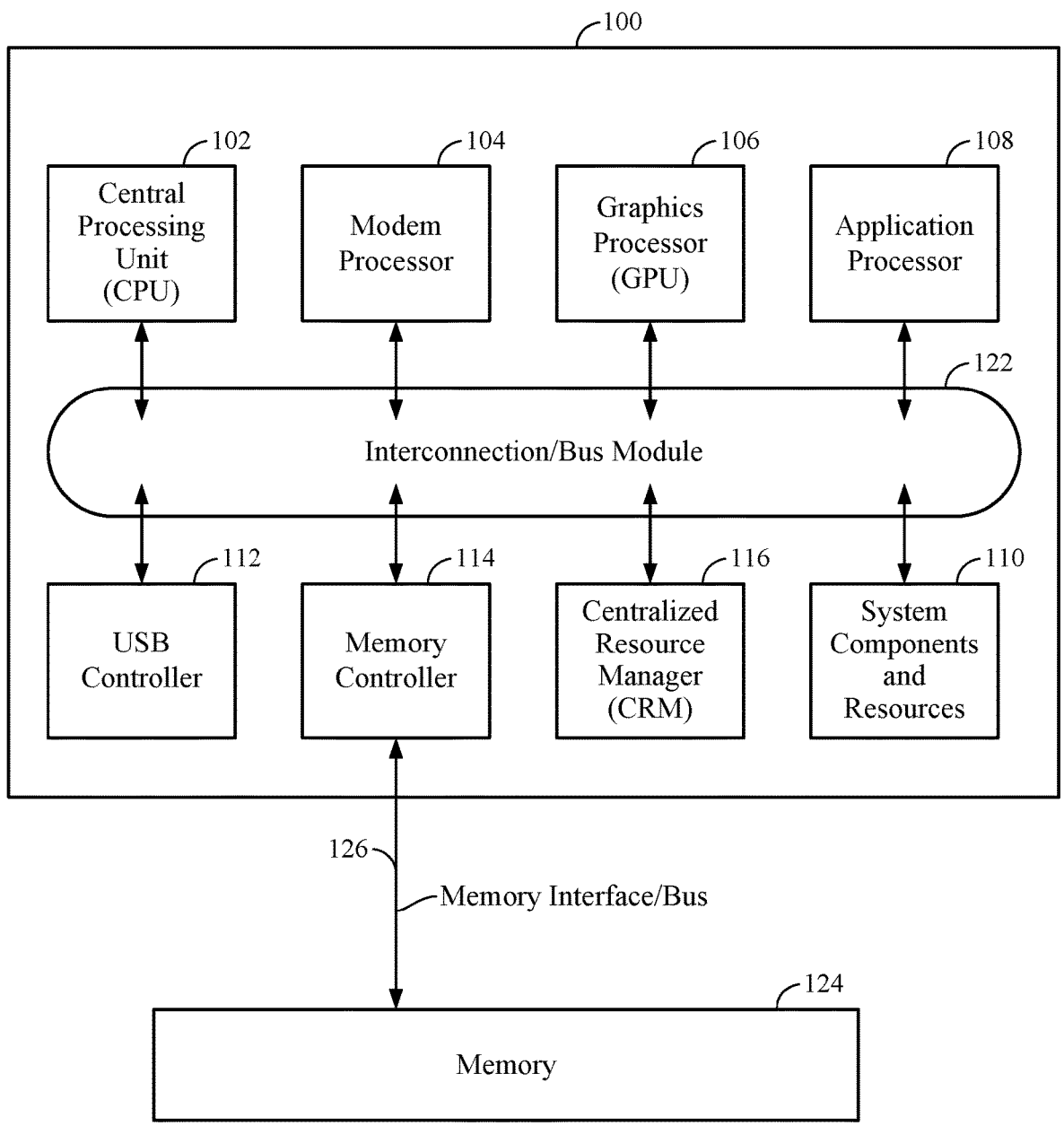
FIG. 1 illustrates an example implementation of a system-on-a-chip (SOC).

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Example SoC

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. In certain aspects, the memory 124 may be implemented using a static random access memory (SRAM), as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example SRAM

Figure 2:
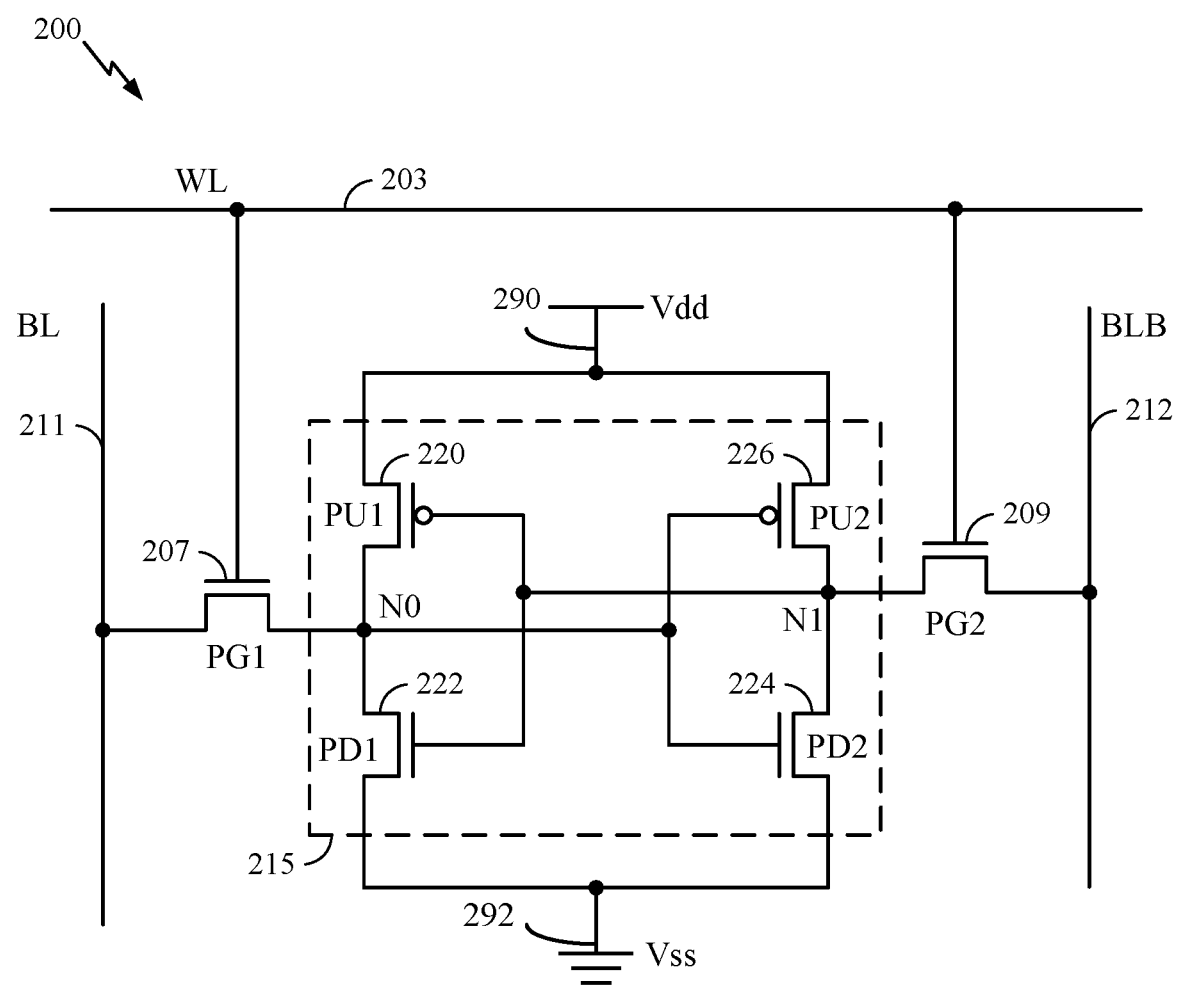
FIG. 2 is a schematic diagram of a memory cell of a static random access memory (SRAM), in accordance with certain aspects of the present disclosure.

FIG. 2 is a schematic diagram of a memory cell 200 of a static random access memory (SRAM), in accordance with certain aspects of the present disclosure. As illustrated, the memory cell 200 may be coupled to a word line (WL) 203 of the SRAM. The WL 203 is coupled to a control input of a pass-gate (PG) transistor 207 (labeled "PG1") for selectively coupling a bit line (BL) 211 of the SRAM to node N0 (also referred to as an output node) of a flip-flop (FF) 215, and is coupled to a control input of a PG transistor 209 (labeled "PG2") for selectively coupling a complementary bit line (BLB) 212 to node N1 (also referred to as a complementary output node) of the FF 215.

As illustrated, the FF 215 is coupled between a voltage rail node 290 (e.g., Vdd) and a reference potential node 292 (e.g., electric ground or Vss). The FF 215 includes a pull-up (PU) transistor 220 (labeled "PU1," e.g., a p-type metal-oxide-semiconductor (PMOS) transistor) having a drain coupled to a drain of a pull-down (PD) transistor 222 (labeled "PD1," e.g., an n-type metal-oxide-semiconductor (NMOS) transistor), forming part of node N0. The FF 215 also includes a PU transistor 226 (labeled "PU2") having a drain coupled to a drain of a PD transistor 224 (labeled "PD2"), forming part of node N1. The gates of the PU transistor 220 and the PD transistor 222 are coupled to the node N1, and the gates of the PU transistor 226 and the PD transistor 224 are coupled to the node N0, as illustrated. The nodes N0 and N1 represent the output and complementary output nodes of the FF 215, respectively.

The SRAM cell characteristics (e.g., read and write margins) are impacted by the PU/PD transistor drive current strength ratio. As used herein, drive current strength generally refers to a transistor's capability to drive current (e.g., drain-to-source current (Ids) or source-to-drain current (Isd)) to a specific node. SRAM functionality depends on the transistor drive current strength ratios, which may be referred to as "PU ratio" and "PD ratio." The PD ratio impacts the read margin of the SRAM cell and refers to the ratio of the drive current strength of the PD transistor over the drive current strength of the PG transistor. The PU ratio impacts the write margin of the SRAM cell and refers to the ratio of the drive current strength of the PU transistor over the drive current strength of the PG transistor. To avoid (or at least reduce) memory failures, the drive current strength of the PD transistor should be higher than the drive current strength of the PG transistor.

Certain aspects of the present disclosure are directed to increasing the threshold voltage of the PG transistor to improve the read margin of the SRAM cell. In other words, increasing the threshold voltage of the PG transistor decreases the drive current strength of the PG transistor, improving the read margin.

Figure 3:
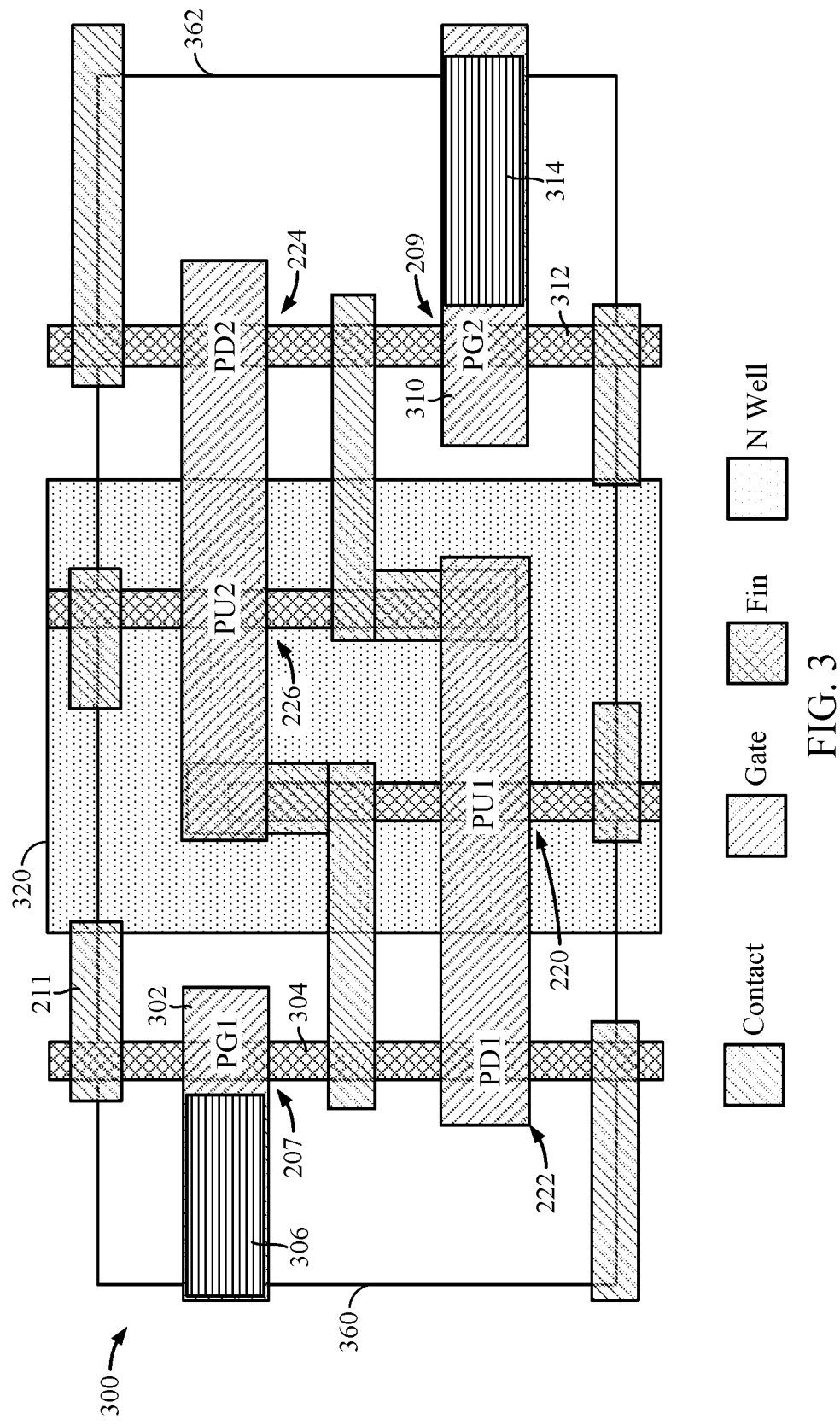
FIG. 3 is an example layout of an SRAM cell implemented with an extended contact region, in accordance with certain aspects of the present disclosure.

FIG. 3 is an example layout of an SRAM cell 300 implemented with an extended contact region, in accordance with certain aspects of the present disclosure. For example, a contact 306 may be extended from a side 360 of the SRAM cell to a region adjacent to the fin 304, as described in more detail herein. In other words, at least a portion of the contact 306 is offset from the side 360. As described in more detail with respect to FIG. 4, the side 360 may be a region of the SRAM that is at a midpoint between two adjacent SRAM cells. In this case, the contact 306 may extend from the side 360 in the opposite direction, as well, and this would still be considered herein as at least a portion of the contact 306 being offset from the side 360.

As illustrated, the SRAM cell 300 includes an n-well region 320 on which PMOS transistors (e.g., PU transistors 220, 226) may be formed. A portion of the gate region 302 is disposed over the fin 304, forming the PG transistor 207. The contact 306 may be coupled to the gate region 302 for electrical contact to the gate of the PG transistor 207. In certain aspects, the contact 306 may extend over at least a portion of the gate region 302.

The spacing between the contact and the channel (e.g., fin) of an NMOS transistor correlates to the threshold voltage of the NMOS transistor. For example, for NMOS transistors (e.g., PG transistor 207), the closer the contact (e.g., contact 306) for the gate of the NMOS transistor is to the channel (e.g., fin 304) of the transistor, the higher the threshold voltage of the transistor. Therefore, by extending the contact 306 from the edge of the SRAM cell 300, for example, at least a portion of the contact 306 may be formed in closer proximity to the fin 304 as compared to conventional implementations (e.g., where the contact is located only at the edge of an SRAM cell), thereby increasing the threshold voltage of the PG transistor 207 to improve the read margin of the SRAM cell 300. For example, the contact 306 may extend from the side 360 of the SRAM cell 300 to a region adjacent to (e.g., above) the fin 304.

Similarly, a portion of the gate region 310 is disposed over the fin 312, forming the PG transistor 209. A contact 314 may be coupled to the gate region 310 for electrical contact to the gate of the PG transistor 209, as illustrated. At least a portion of the contact 314 may be formed in closer proximity to the fin 312 as compared to conventional implementations, increasing the threshold voltage of the PG transistor 209 to improve the read margin of the SRAM cell 300. For example, the contact 314 may extend from a side 362 to a region adjacent to (e.g., above) the fin 312, as illustrated in FIG. 3.

Figure 4:
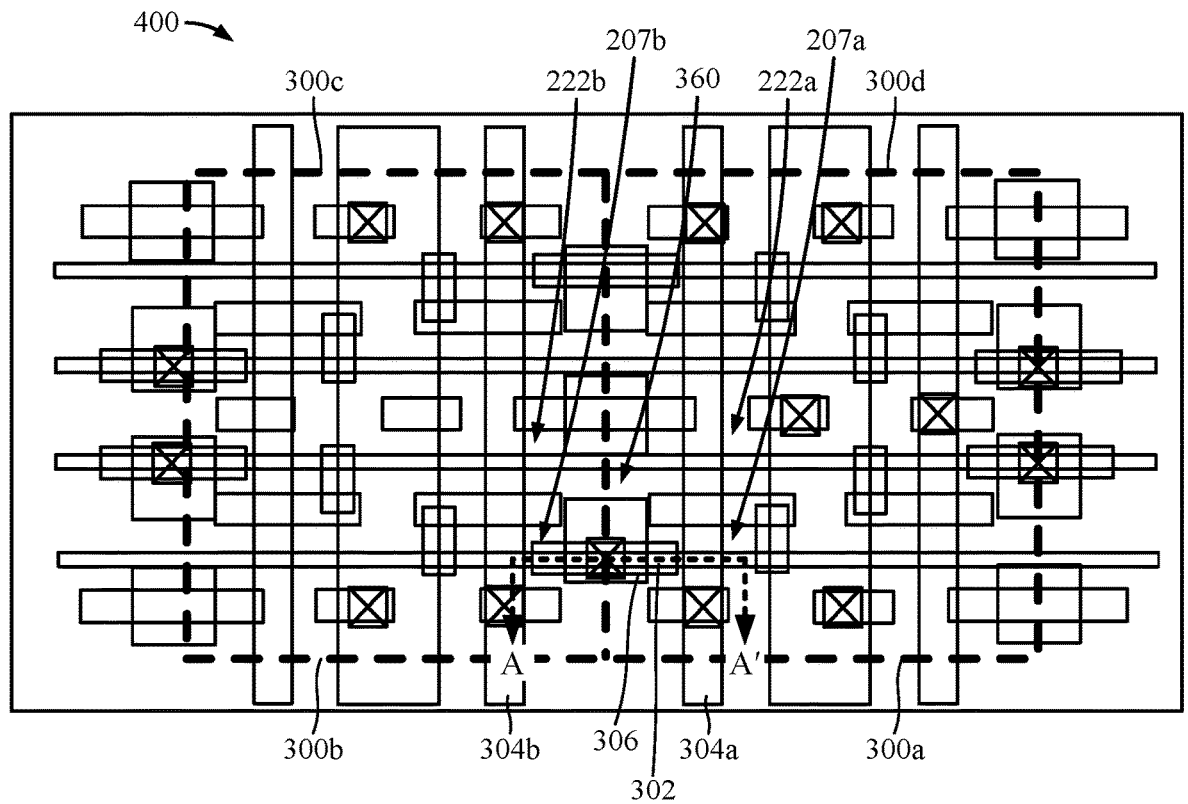
FIG. 4 is a layout of multiple SRAM cells, in accordance with certain aspects of the present disclosure.

FIG. 4 is a layout 400 of multiple SRAM cells 300a, 300b, 300c, and 300d, in accordance with certain aspects of the present disclosure. Each of the SRAM cells 300a, 300b, 300c, and 300d may correspond to the SRAM cell 300 described with respect to FIG. 3. As illustrated, the contact 306 may be extended such that a portion of the contact 306 is in close proximity to the fin 304a of the PG transistor 207a of the SRAM cell 300a and another portion of the contact 306 is in close proximity to the fin 304b of the PG transistor 207b of the SRAM cell 300b. Each of the fin 304a of the PG transistor 207a and the fin 304b of the PG transistor 207b may correspond to the fin 304 of the PG transistor 207 described with respect to FIG. 3. As illustrated, the fin 304a may be used to form both the PG transistor 207a and the PD transistor 222a, and the fin 304b may be used to form both the PG transistor 207b and the PD transistor 222b.

Figure 5:
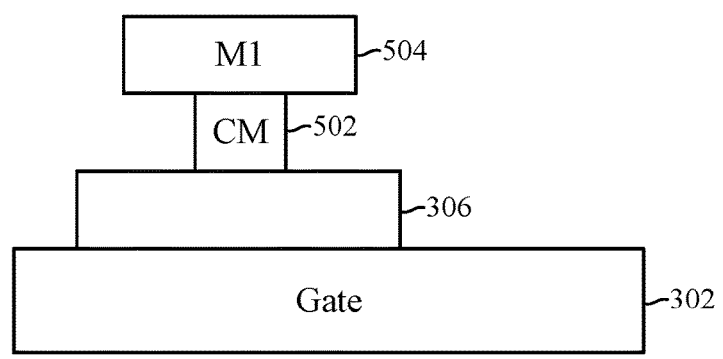
FIG. 5 illustrates a cross-section of a contact disposed on a gate region of an SRAM, in accordance with certain aspects of the present disclosure.

FIG. 5 illustrates a cross-section of the contact 306 disposed above the gate region 302 through line A-A' of FIG. 4, in accordance with certain aspects of the present disclosure. As illustrated, the contact 306 is disposed between the gate region 302 and a contact metal (CM) 502. The CM 502 facilitates electrically connectivity to an M1 layer contact 504. In certain aspects, the contact 306 may be a dummy contact (e.g., any contact at a floating potential).

As used herein, a contact (or at least a portion thereof) is considered to be offset from the midpoint between SRAM cells if the contact (or at least a portion thereof) is at least 10 nm away from the midpoint towards a fin of a PG transistor of one or both of the SRAM cells. By placing the contact 306 in closer proximity to the fin 304 as compared to conventional implementations, the threshold voltage of the PG transistor 207 is increased, improving the read margin of the RAM cell 300.

Figure 6:
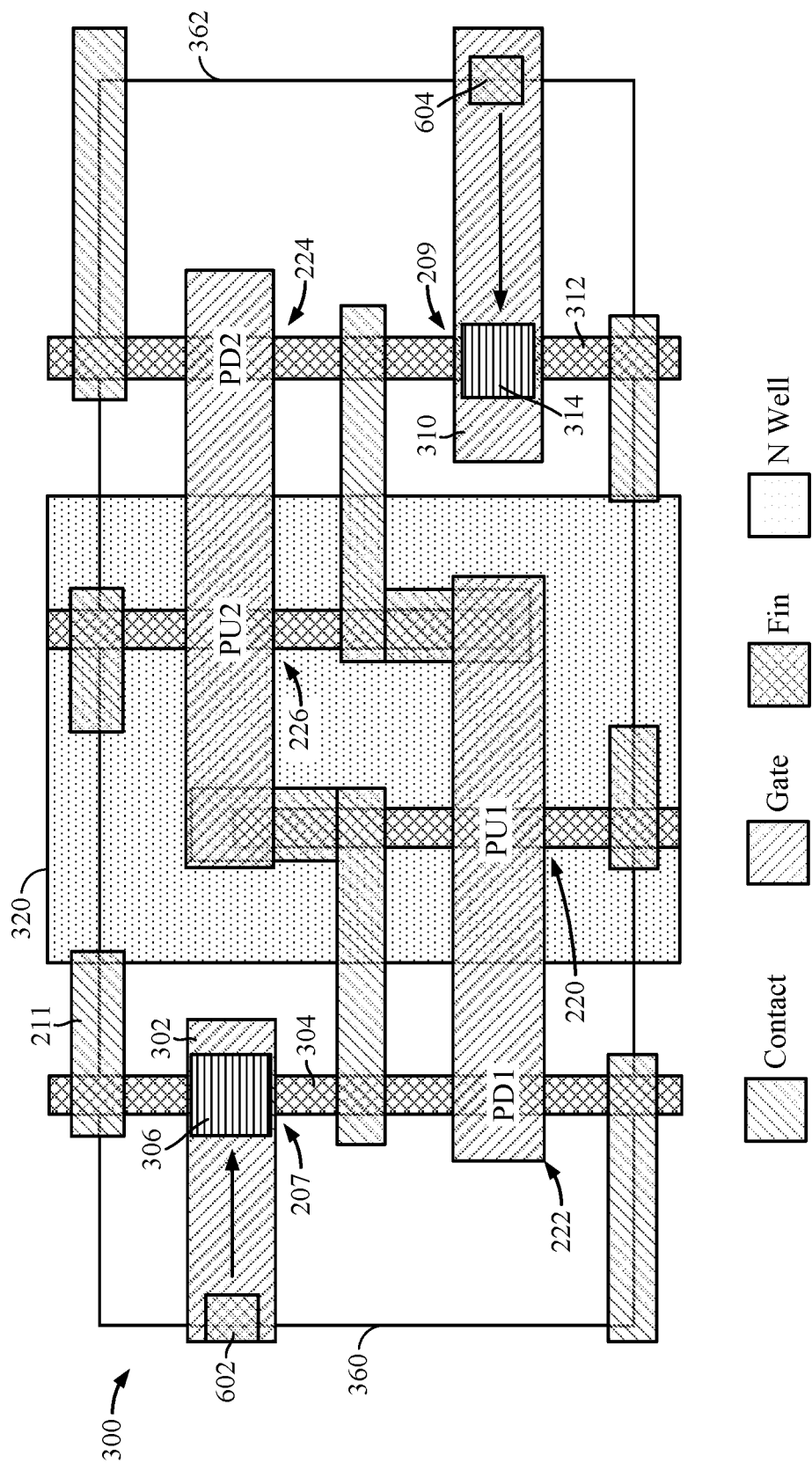
FIG. 6 is an example layout of an SRAM cell implemented with an offset contact region, in accordance with certain aspects of the present disclosure.

FIG. 6 is an example layout of an SRAM cell 300 implemented with an offset contact region, in accordance with certain aspects of the present disclosure. In other words, instead of the contact 306 being disposed at region 602 (e.g., at side 360) or extending from the side to near the fin 304 as in FIG. 3, the contact 306 may be relocated away from region 602 (e.g., disposed above the fin 304). That is, the contact 306 in FIG. 6 is offset from a midpoint (e.g., at side 360) between the SRAM cell 300a and the SRAM cell 300b. In other words, the contact 306 may be disposed closer to the fin 304 of the PG transistor 207 of the SRAM cell 300 and further from a fin of a PG transistor of an SRAM cell that is adjacent to the SRAM cell 300.

Similarly, instead of the contact 314 being disposed at region 604 (e.g., at side 362) or extending from the side to near the fin 314 as in FIG. 3, the contact 306 in FIG. 6 is relocated away from region 604 (e.g., disposed above the fin 312). For example, by placing the contact 314 in closer proximity to the fin 312 as compared to conventional implementations, the threshold voltage of the PG transistor 209 is increased, improving the read margin of the SRAM cell 300.

Figure 7:
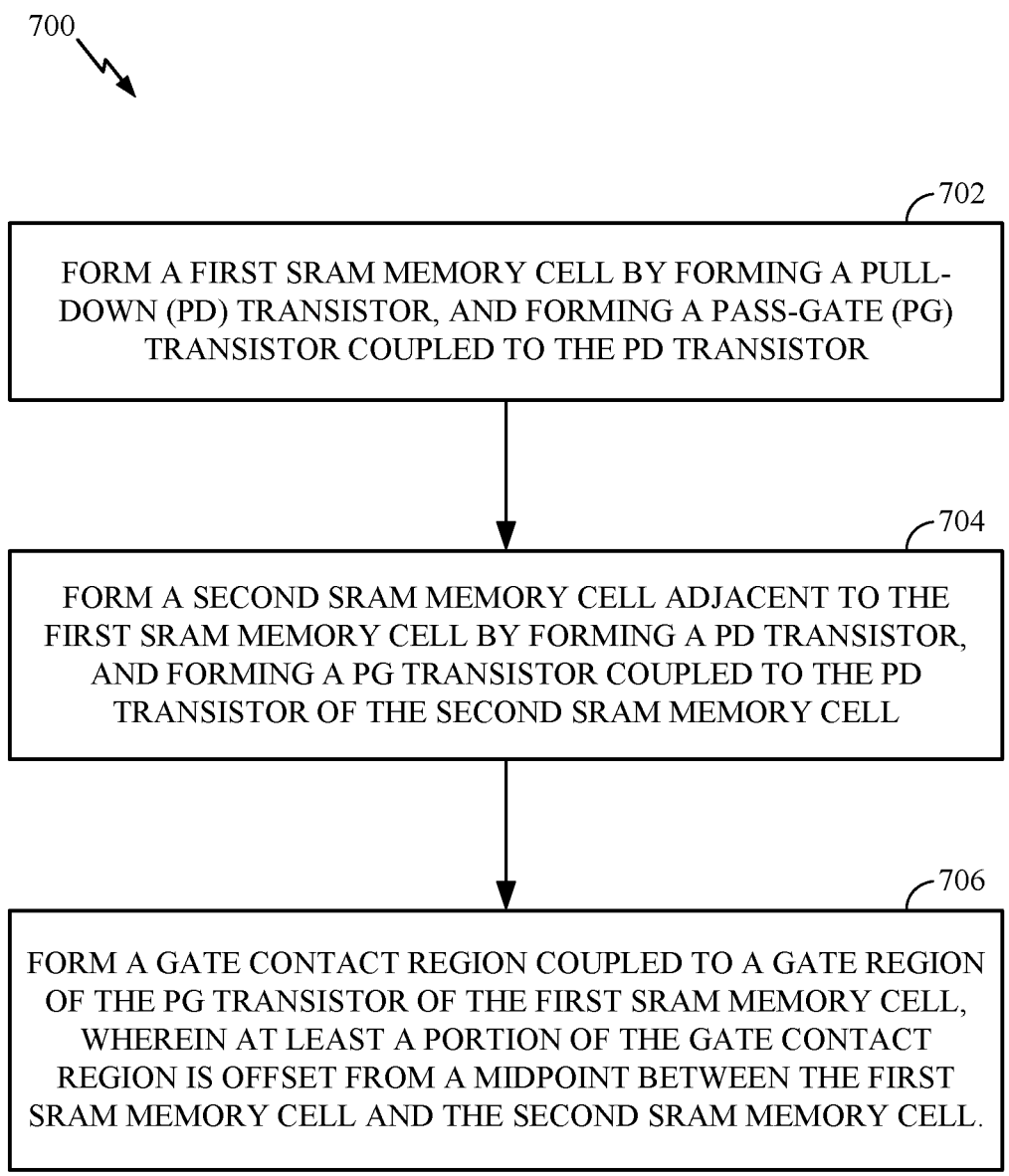
FIG. 7 is a flow diagram illustrating example operations for fabricating an SRAM, in accordance with certain aspects of the present disclosure.

FIG. 7 is a flow diagram illustrating example operations 700 for fabricating an SRAM, in accordance with certain aspects of the present disclosure. The operations 700 may be performed by semiconductor fabrication facility.

The operations 700 begin, at block 702, with the facility forming a first SRAM cell (e.g., memory cell 300a) by forming a PD transistor (e.g., PD transistor 222a), and forming a PG transistor (e.g., PG transistor 207a) coupled to the PD transistor, and at block 704, forming a second SRAM cell (e.g., memory cell 300b) adjacent to the first SRAM cell by forming a PD transistor (e.g., PD transistor 222b), and forming a PG transistor (e.g., PG transistor 207b) coupled to the PD transistor of the second SRAM cell. At block 706, the facility may form a gate contact region (e.g., contact 306) coupled to a gate region of the PG transistor of the first SRAM cell, wherein at least a portion of the gate contact region is offset from a midpoint (e.g., side 360) between the first SRAM cell and the second SRAM cell.

In certain aspects, the gate region of the PG transistor of the first SRAM cell extends from above a channel (e.g., fin 304a) of the PG transistor of the first SRAM cell to above a channel of the PG transistor of the second SRAM cell. In certain aspects, the gate contact region extends from the midpoint between the first SRAM cell and the second SRAM cell to a region adjacent to a channel (e.g., fin 304a) of the PG transistor of the first SRAM cell. In certain aspects, the gate contact region further extends from the midpoint between the first SRAM cell and the second SRAM cell to a region adjacent to a channel (e.g., fin 304b) of the PG transistor of the second SRAM cell. In some cases, each of the channels of the PG transistors of the first SRAM cell and the second SRAM cell comprises a fin.

In certain aspects, the gate contact region is disposed above a channel of the PG transistor of the first SRAM cell. In certain aspects, the gate region is disposed between gate contact region and the channel of the PG transistor of the first SRAM cell. In some cases, each of the PD transistor and the PG transistor of the first SRAM cell is a FinFET. In certain aspects, the PD transistor and the PG transistor share the same fin.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A static random access memory (SRAM) comprising:
   a first SRAM cell having:
      a pull-down (PD) transistor; and
      a pass-gate (PG) transistor coupled to the PD transistor;
   a second SRAM cell, the second SRAM cell being adjacent to the first SRAM cell and having:
      a PD transistor; and
      a PG transistor coupled to the PD transistor of the second SRAM cell; and
   a gate contact region coupled to a gate region of the PG transistor of the first SRAM cell, wherein a center of the gate contact region along a longitudinal axis thereof is offset from a midpoint between the first SRAM cell and the second SRAM cell, wherein a first portion of the gate contact region is disposed in the first SRAM cell, and wherein a second portion of the gate contact region is disposed in the second SRAM cell.

2. The SRAM of claim 1, wherein the gate contact region is disposed above a channel of the PG transistor of the first SRAM cell.

3. The SRAM of claim 2, wherein the gate region is disposed between the gate contact region and the channel of the PG transistor of the first SRAM cell.

4. The SRAM of claim 1, wherein each of the PD transistor and the PG transistor of the first SRAM cell is a fin field-effect transistor (FinFET).

5. The SRAM of claim 4, wherein the PD transistor and the PG transistor of the first SRAM cell share the same fin.

6. The SRAM of claim 1, wherein the first SRAM cell comprises a pull-up (PU) transistor coupled to the PG transistor of the first SRAM cell, the PU transistor being a p-type metal-oxide-semiconductor (PMOS) transistor.

7. The SRAM of claim 6, wherein each of the PD transistor, the PU transistor, and the PG transistor of the first SRAM cell is a fin field-effect transistor (FinFET), wherein the PD transistor and the PG transistor are implemented with a first fin, and wherein the PU transistor is implemented with a second fin.

8. A method for fabricating a static random access memory (SRAM), comprising:
   forming a first SRAM cell by forming a pull-down (PD) transistor and forming a pass-gate (PG) transistor coupled to the PD transistor;
   forming a second SRAM cell adjacent to the first SRAM cell by forming a PD transistor and forming a PG transistor coupled to the PD transistor of the second SRAM cell; and
   forming a gate contact region coupled to a gate region of the PG transistor of the first SRAM cell, wherein a center of the gate contact region along a longitudinal axis thereof is offset from a midpoint between the first SRAM cell and the second SRAM cell, wherein a first portion of the gate contact region is disposed in the first SRAM cell, and wherein a second portion of the gate contact region is disposed in the second SRAM cell.

9. The method of claim 8, wherein the gate contact region is disposed above a channel of the PG transistor of the first SRAM cell.

10. The method of claim 9, wherein the gate region is disposed between gate contact region and the channel of the PG transistor of the first SRAM cell.

11. The method of claim 8, wherein each of the PD transistor and the PG transistor of the first SRAM cell is a fin field-effect transistor (FinFET).

12. The method of claim 11, wherein the PD transistor and the PG transistor of the first SRAM cell share the same fin.

13. The method of claim 8, wherein the first SRAM cell comprises a pull-up (PU) transistor coupled to the PG transistor of the first SRAM cell, the PU transistor being a p-type metal-oxide-semiconductor (PMOS) transistor.

14. The method of claim 13, wherein each of the PD transistor, the PU transistor, and the PG transistor of the first SRAM cell is a FinFET, wherein the PD transistor and the PG transistor are implemented with a first fin, and wherein the PU transistor is implemented with a second fin.

* * * * *